United States Patent
Niederloehner et al.

(10) Patent No.: US 9,557,426 B2
(45) Date of Patent: Jan. 31, 2017

(54) X-RAY RADIATION DETECTOR AND METHOD FOR MEASURING X-RAY RADIATION

(71) Applicant: Siemens Aktiengesellschaft, Munich (DE)

(72) Inventors: Daniel Niederloehner, Erlangen (DE); Christian Schroeter, Bamberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 82 days.

(21) Appl. No.: 14/377,233

(22) PCT Filed: Jan. 21, 2013

(86) PCT No.: PCT/EP2013/051031
§ 371 (c)(1),
(2) Date: Aug. 7, 2014

(87) PCT Pub. No.: WO2013/120657
PCT Pub. Date: Aug. 22, 2013

(65) Prior Publication Data
US 2016/0025869 A1  Jan. 28, 2016

(30) Foreign Application Priority Data
Feb. 14, 2012 (DE) .......... 10 2012 202 200

(51) Int. Cl.
*H01L 27/146* (2006.01)
*G01T 1/24* (2006.01)
(Continued)

(52) U.S. Cl.
CPC ............ *G01T 1/24* (2013.01); *H01L 31/115* (2013.01); *G01T 1/2018* (2013.01); *H04N 5/32* (2013.01)

(58) Field of Classification Search
CPC .................. H04N 5/32; G01T 1/2018
(Continued)

(56) References Cited

U.S. PATENT DOCUMENTS 5,563,421 A  10/1996 Cheung
5,905,772 A   5/1999 Conrads
(Continued)

FOREIGN PATENT DOCUMENTS

CN   101652676 A   2/2010
DE   102009024225 A1   12/2010
(Continued)

OTHER PUBLICATIONS

Chinese Office Action mailed Sep. 14, 2015.
(Continued)

*Primary Examiner* — David J Makiya
*Assistant Examiner* — Kenneth J Malkowski
(74) *Attorney, Agent, or Firm* — Harness, Dickey & Pierce, P.L.C.

(57) ABSTRACT

An x-ray radiation detector is disclosed with an upper side, which faces an x-ray radiation source during operation, and with a semiconductor layer for direct conversion of x-ray radiation into electric measurement signals. In an embodiment, a luminous film is arranged between the upper side and the semiconductor layer, and with the aid of which luminous film, electromagnetic radiation can be coupled into the semiconductor layer.

20 Claims, 3 Drawing Sheets

(51) Int. Cl.
*H01L 31/115* (2006.01)
*G01T 1/20* (2006.01)
*H04N 5/32* (2006.01)

(58) Field of Classification Search
USPC .................................. 250/370.09, 361 R
See application file for complete search history.

(56) References Cited

U.S. PATENT DOCUMENTS

| | | | |
|---|---|---|---|
| 7,652,258 | B2 | 1/2010 | El-Hanany |
| 8,294,112 | B2 * | 10/2012 | Levene ................. G01T 1/1644 |
| | | | 250/361 R |
| 2010/0140484 | A1 | 6/2010 | Snoeren et al. |
| 2010/0327169 | A1 * | 12/2010 | Korn ..................... G01T 1/2018 |
| | | | 250/363.01 |
| 2011/0024641 | A1 | 2/2011 | Masayoshi |
| 2011/0049371 | A1 | 3/2011 | Kobayashi |
| 2014/0091228 | A1 * | 4/2014 | Yamakawa ............... G01T 1/24 |
| | | | 250/370.09 |
| 2014/0110595 | A1 * | 4/2014 | Iwakiri ................ A61B 6/4233 |
| | | | 250/394 |

FOREIGN PATENT DOCUMENTS

| | | |
|---|---|---|
| EP | 1631067 A2 | 3/2006 |
| JP | 2004033659 A | 2/2004 |
| JP | 2011053037 A | 3/2011 |
| KR | 101042046 B1 | 6/2011 |
| WO | WO 2006097129 | 9/2006 |

OTHER PUBLICATIONS

Office Action for corresponding Korean Application No. 10-2014-7025277 dated May 27, 2016 and English translation thereof.

* cited by examiner

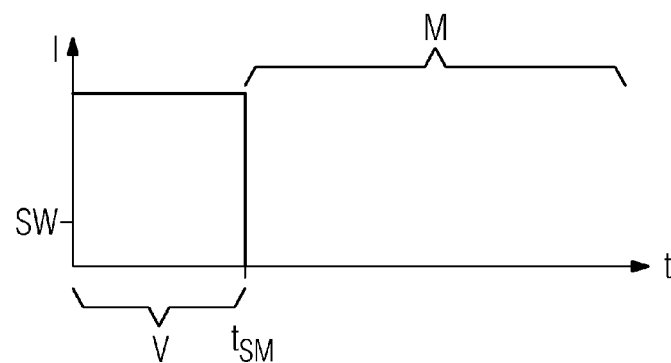
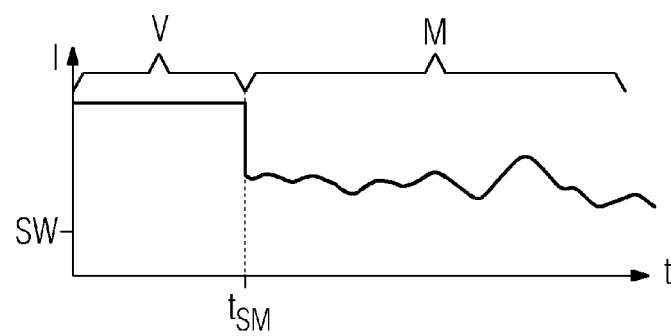
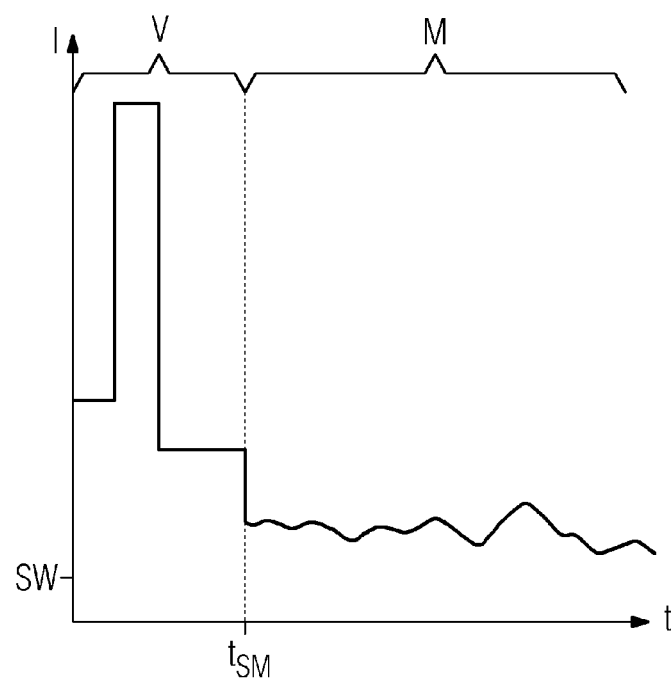

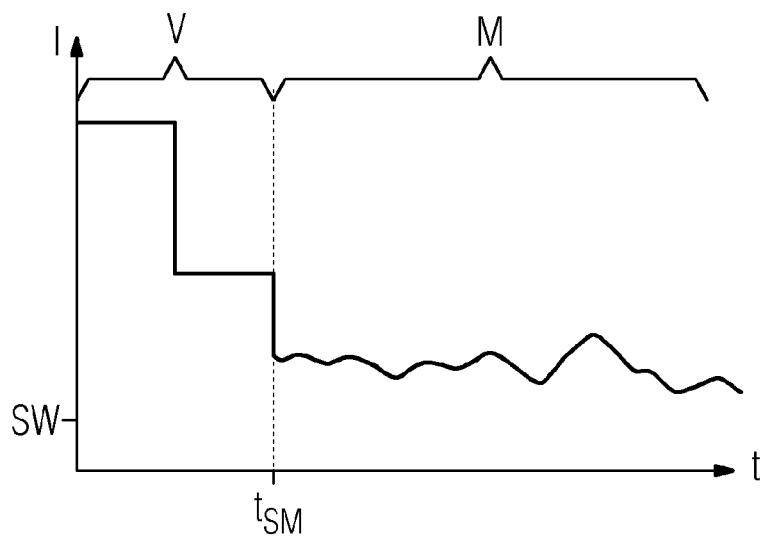
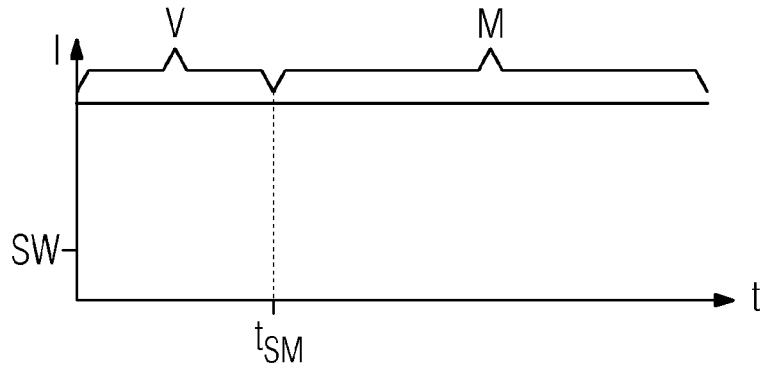

X-RAY RADIATION DETECTOR AND METHOD FOR MEASURING X-RAY RADIATION

PRIORITY STATEMENT

This application is the national phase under 35 U.S.C. §371 of PCT International Application No. PCT/EP2013/051031 which has an International filing date of Jan. 21, 2013, which designated the United States of America, and which claims priority to German patent application number DE 102012202200.7 filed Feb. 14, 2012, the entire contents of each of which are hereby incorporated herein by reference.

FIELD

At least one embodiment of the invention generally relates to an X-ray radiation detector with an upper side, which faces an X-ray radiation source during operation, and with a semiconductor layer for direct conversion of X-ray radiation into electrical measuring signals. In addition, at least one embodiment of the invention generally relates to a method for the measurement of X-ray radiation with the aid of such an X-ray radiation detector.

BACKGROUND

An X-ray radiation detector is known from U.S. Pat. No. 7,652,258 B2.

In imaging systems, such as for example computer tomographs, directly converting detectors are increasingly employed for the detection of X-ray radiation, in which the radiation to be detected is converted directly into an electrical measuring signal in a semiconductor layer composed for example of CdTe, CdZnTe, CdZnTeSe, CdTeSe, CdMnTe, InP, $TlBr_2$ or $HgI_2$.

Typical of semiconductor materials of this kind is a relatively high concentration of lattice defects, which inter alia are electrically effective as so-called "traps" for electrons. As a rule, many of the energy levels belonging to these impurities are unoccupied under normal conditions, and are occupied only upon irradiation of the semiconductor with X-ray radiation. The electrons occupying these energy levels are subsequently bound to the defect and thus remain permanently fixed in the semiconductor crystal, giving rise to a radiation-dependent polarization of the semiconductor crystal. A falsification of the measuring signal results from this, firstly because some of the free charge carriers generated by the radiation to be detected no longer contribute to the measuring signal, but are in part captured by the impurities, and secondly because the electrical displacement field having an effect in the semiconductor material changes as a result of the fixed charges.

In patent U.S. Pat. No. 7,652,258 B2, it is proposed to irradiate the detector with infrared radiation, in order thus to prescribe an occupation of the impurity levels and thus to prescribe the polarization status with the aid of the infrared radiation. The infrared radiation is hereby generated in a laborious manner in an additional infrared generator and coupled into the detector structure.

SUMMARY

At least one embodiment of the invention is directed to an improved X-ray radiation detector with simplified structure and/or an improved method for the measurement of X-ray radiation.

According to at least one embodiment of the invention of the X-ray detector, an X-ray radiation detector is disclosed. The related claims contain in part advantageous and in part in themselves inventive developments of this embodiment of the invention.

The X-ray radiation detector of at least one embodiment includes a surface, which faces an X-ray radiation source during operation, and a semiconductor layer for direct conversion of X-ray radiation into electrical measuring signals. A luminous film is arranged between the upper side and the semiconductor layer, with the aid of which during operation electromagnetic radiation is coupled into the semiconductor layer in a planar manner, at least temporarily. The luminous film is here in particular integrated into the structure of the X-ray radiation detector, so that the electromagnetic radiation is generated directly in the X-ray radiation detector and beamed into the semiconductor layer preferably without optical aids, such as for example mirrors, lenses or light-conducting fibers. Because of the planar form of the source for the electromagnetic radiation the electromagnetic radiation can be particularly evenly coupled into the semiconductor layer, as a result of which the polarization within the semiconductor layer and over the entire volume of the semiconductor layer can be prescribed in a particularly homogenous manner.

According to an embodiment of the invention, a method is disclosed.

In an embodiment, the method serves the measurement of X-ray radiation by way of an X-ray radiation detector with an upper side, which faces an X-ray radiation source during operation, and with a semiconductor layer for direct conversion of X-ray radiation into electrical measuring signals, wherein a luminous film is provided, with the aid of which infrared radiation is coupled into the semiconductor layer, at least temporarily. The X-ray radiation detector is here in particular embodied according to one of the previously described variants, wherein the luminous film is preferably integrated into the structure of the X-ray radiation detector, so that the infrared radiation is irradiated directly into the semiconductor layer in a planar manner and without the assistance of further optical aids.

BRIEF DESCRIPTION OF THE DRAWINGS

Example embodiments of the invention are explained below on the basis of a schematic drawing. Wherein:

FIG. 3 shows a first method- and time-dependent intensity of the generated infrared radiation in a diagram, FIG. 4 shows a second method- and time-dependent intensity of the generated infrared radiation in a diagram, FIG. 5 shows a third method- and time-dependent intensity of the generated infrared radiation in a diagram, FIG. 6 shows a fourth method- and time-dependent intensity of the generated infrared radiation in a diagram and FIG. 7 shows a fifth method- and time-dependent intensity of the generated infrared radiation in a diagram.

Parts corresponding to each other are in each case provided with the same reference characters in all figures.

DETAILED DESCRIPTION OF THE EXAMPLE EMBODIMENTS

Figure 1:
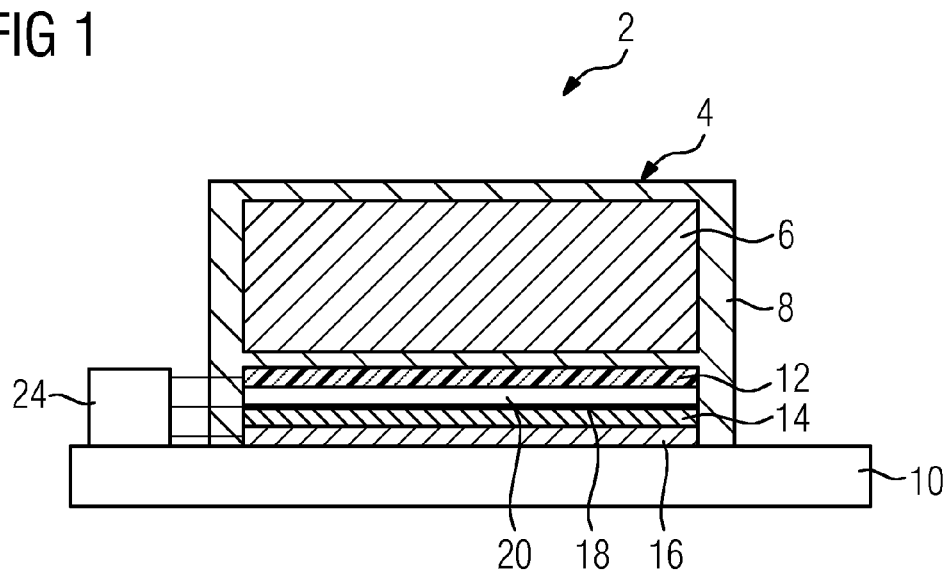
FIG. 1 shows an X-ray radiation detector in a sectional representation.

The X-ray radiation detector of at least one embodiment includes a surface, which faces an X-ray radiation source during operation, and a semiconductor layer for direct conversion of X-ray radiation into electrical measuring signals. A luminous film is arranged between the upper side and the semiconductor layer, with the aid of which during operation electromagnetic radiation is coupled into the semiconductor layer in a planar manner, at least temporarily. The luminous film is here in particular integrated into the structure of the X-ray radiation detector, so that the electromagnetic radiation is generated directly in the X-ray radiation detector and beamed into the semiconductor layer preferably without optical aids, such as for example mirrors, lenses or light-conducting fibers. Because of the planar form of the source for the electromagnetic radiation the electromagnetic radiation can be particularly evenly coupled into the semiconductor layer, as a result of which the polarization within the semiconductor layer and over the entire volume of the semiconductor layer can be prescribed in a particularly homogenous manner.

Electromagnetic radiation with a wavelength greater than 500 nm and in particular infrared radiation is preferably used as electromagnetic radiation.

Preferably, there is an additional variant of the X-ray radiation detector, in which the luminous film completely covers the surface of the semiconductor layer. The luminous film here functions as a second functional layer augmenting the semiconductor layer and arranged between the upper side and the semiconductor layer, which is composed of materials which are permeable or at least partially permeable to X-ray radiation. Materials of minimal thickness and/or low atomic number are preferably used here. The thickness of the luminous film or luminescent layer is additionally kept as small as possible. Such a layered structure of the X-ray detector or detector unit can be realized with relatively little technical effort, which significantly simplifies the manufacture of corresponding detectors or detector units.

Further, a variant of the X-ray radiation detector is expedient in which a filter film is additionally provided between the luminous film and the semiconductor layer. The frequency spectrum of the radiation coupled into the semiconductor layer can hereby be limited to a particularly favorable frequency band in an especially simple manner.

According to an example embodiment of the X-ray radiation detector, an organic LED film (OLED film) is provided as the luminous film. In an advantageous alternative to this, an electroluminescence film is employed as the luminous film, that is in particular a film in which the so-called Destriau effect is used to generate electromagnetic radiation. Both types of film can be integrated into existing detector designs without major technical effort and manufactured with relatively low technical and financial outlay. A relatively broad emission spectrum is typical in the case of luminous films of this kind which are currently manufactured for commercial purposes, for which reason these are preferably augmented by filter films, so that a source of infrared radiation with wavelengths between 600 nm and 900 nm is hereby realized.

Additionally advantageous is a variant of the X-ray radiation detector in which the luminous film comprises a number of segments which can be actuated independently of each other. This is also understood to mean an embodiment in which a sort of layer comprising a multiplicity of individual luminous films which can be actuated independently of each other is arranged between the upper side and the semiconductor layer. Different areas in the semiconductor layer can hereby for example be irradiated with different intensity, which is for example advantageous if there are local differences in the concentration of the impurities within the semiconductor layer.

In an advantageous development, the X-ray radiation detector is created from a multiplicity of functional units, wherein each functional unit comprises a number of detector pixels and wherein at least one segment or one luminous film is assigned to each functional unit. A corresponding functional unit can here be determined in that the semiconductor layer of a functional unit is formed by a monocrystal or that a switching unit, thus for example a read-out chip, is provided for each functional unit. In a computer tomograph, for example, the X-ray radiation detector is typically put together from a multiplicity of so-called "modules", of essentially identical structure and strung together in the form of an arc, wherein the modules are arranged next to each other to form a detector arc. The modules themselves for example have a rectangular detector surface and are put together from the individual functional units, the so-called "samples". The "samples" in turn have contiguous semiconductor layers, and are thus not made up of smaller semiconductor pieces. Here, the "samples" typically comprise a multiplicity of pixels. In this case at least one segment or one film is preferably assigned to each "sample".

According to an embodiment of the invention, a method is disclosed.

In an embodiment, the method serves the measurement of X-ray radiation by way of an X-ray radiation detector with an upper side, which faces an X-ray radiation source during operation, and with a semiconductor layer for direct conversion of X-ray radiation into electrical measuring signals, wherein a luminous film is provided, with the aid of which infrared radiation is coupled into the semiconductor layer, at least temporarily. The X-ray radiation detector is here in particular embodied according to one of the previously described variants, wherein the luminous film is preferably integrated into the structure of the X-ray radiation detector, so that the infrared radiation is irradiated directly into the semiconductor layer in a planar manner and without the assistance of further optical aids.

Included here is a variant embodiment of the method, in which the luminous film comprises a number of segments which can be actuated independently of each other and in which segments are individually actuated during operation in such a way that the segments generate infrared radiation of different intensity. "Segments" is here also taken to mean an embodiment in which a multiplicity of individual luminous films form a sort of luminous film layer. The individual luminous films here form the segments. In this way, for example, various areas of the semiconductor layer can be irradiated with a different and the local intensity, so that, for example, an adjustment of the local irradiation intensity to local differences in impurity density of the semiconductor layer can hereby take place.

According to a further advantageous variant of an embodiment of the method, the X-ray radiation detector is built up from a multiplicity of function units, which in each case comprise a number of detector pixels, wherein a multiplicity of segments are assigned to each functional unit, which can be actuated independently of each other. In particular, the segments are individually actuated during operation, in such a way that infrared radiation is coupled into each functional unit in a central area and in a peripheral area with different intensity.

Such a functional unit is here in particular characterized in that the semiconductor layer of the functional unit is provided by a monocrystal. Accordingly, surfaces of the monocrystals are positioned in the peripheral area of the functional unit and as a result of this the semiconductor layer has a higher density of impurity level in this area. As these impurity levels are preferably to be completely occupied before the start of each measurement, the peripheral area is preferably more intensively irradiated with infrared radiation than the central area, in which the density of the impurity level is lower compared with the peripheral area.

Further expedient is one variant embodiment of the method, in which the intensity of the infrared radiation is kept above a threshold value and in particular also kept constant during a preliminary phase, preferably before the start of each measurement. The threshold value is here expediently in particular selected such that as a result of the irradiation of the semiconductor layer with the infrared radiation the impurity levels are essentially completely occupied. According to an expedient alternative embodiment, the intensity varies during the preliminary phase.

Furthermore, one variant of the method is expedient in which the intensity of the infrared radiation is reduced at the start of the measuring phase following the preliminary phase and in particular regulated down to a value around 0, or switched off. This variant is then in particular advantageous, if the photons of the infrared radiation have an energy which broadly corresponds to the band gap of the material used for the semiconductor layer, as in this case the infrared radiation also generates increased electron hole-pairs and contributes to the electrical measuring signals.

In one example embodiment, the intensity of the infrared radiation during a measuring phase following the preliminary phase is regulated independently of the expected X-ray radiation flow, that is the intensity of the X-ray radiation. The regulation here takes place for example on the basis of a calculated X-ray flow, which is determined based on the data from a topogram of the patient previously performed. Here no fixed target value is prescribed for the regulation, to the benefit of simple implementation, rather preliminary experiments are conducted to determine which intensity is favorable for a particular anticipated X-ray flow. This information is then defined as measurement or calibration criteria and used as the basis for the regulation.

In addition, one variant embodiment of the method is advantageous, in which the intensity of the infrared radiation is regulated during a measuring phase following the preliminary phase in such way that a generated photocurrent is kept constant. The intensity of the infrared radiation is accordingly adjusted to the intensity of the X-ray radiation to be measured and reaching the detector, so that by way of the combination of incident X-ray radiation and incident infrared radiation, a prescribed photocurrent is always generated. In this method infrared radiation is preferably employed, the photons of which having an energy which is greater than the band gap of the semiconductor material used for the semiconductor layer.

Alternatively a variant embodiment of the method is provided, in which the intensity of the infrared radiation is kept constant during a measuring phase following the preliminary phase and in particular constant at the level of the preliminary phase.

An X-ray radiation detector 2 represented here is embodied here as a so-called direct converter and is preferably used in imaging medical systems, such as for example a computer tomograph. It is here arranged opposite an X-ray radiation source (not shown in greater detail), wherein an upper side 4 of the X-ray radiation source is employed for imaging purposes. The X-ray radiation generated by the X-ray radiation source enters the X-ray radiation detector 2 via the upper side 4 and thus reaches a collimator layer 6, with which unwanted scattered radiation is filtered out. For positioning of the collimator layer 6 this is embedded in a holder structure 8, which is permanently connected to a carrier plate 10, for example made of ceramic material. Attached to the collimator layer 6 in the direction of the holder plate 10 are a luminous film 12, a semiconductor layer 14 and a read-out layer 16 embodied in the manner of an ASIC chip (ASIC: application-specific integrated circuit).

If X-ray radiation now passes through the collimator layer 6 and the luminous film 12 transparent to X-ray radiation into the semiconductor layer 14, this generates freely moving charge carriers in the semiconductor layer 14, in particular electron hole-pairs, which because of a prescribed potential difference between a cathode 18 and the read-out layer 16 are removed and detected in a position-dependent manner in the read-out layer 16, according to a principle which is known per se.

So that all possible free charge carriers generated by the X-ray radiation in the case of a measuring procedure can be removed by the potential difference, and thus contribute to the measuring signal and are not locally bound as a result of lattice defects in the material of the semiconductor layer 14, the semiconductor layer 14 is irradiated with infrared radiation in a preliminary phase before each measuring procedure or each measuring phase, which is generated with the aid of the luminous film 12. The luminous film 12 here covers the surface of the semiconductor layer 14 completely, for which reason infrared radiation can be coupled into the latter evenly across the entire extent of the semiconductor layer 14.

So that the infrared radiation generated by the luminous film 12 can pass through the cathode 18 into the semiconductor layer 14 with as little hindrance as possible, the cathode 18 is designed to be at least partially permeable to infrared radiation, and to X-ray radiation. This is achieved for example in that the material used for the cathode 18 is at least partially transparent to infrared radiation and/or that a suitable structuring is provided for the cathode 18. Depending on the variant of the embodiment, the cathode 18 is, for example, provided by a thin and porous metal film or it is designed in the manner of a grid. Electrical insulation is additionally provided between the luminous film 12 and the cathode 18, which in the exemplary embodiment is realized by means of an air gap 20.

In the case of application in medical technology, in particular in computer tomography, arc-shaped X-ray radiation detectors 2 are frequently employed, in which "modules" embodied as prefabricated structural units lined up next to each other in a carrier structure are used. The "modules" are usually square in shape and lie with their longitudinal sides adjacent to each other. They are embodied as individual functional units 22, so-called "samples", which in turn carry a matrix-like arrangement of pixels. The functional units 22 are typically strung together in a single row along the longitudinal direction of the "modules" (in the direction of the longitudinal sides). The "modules" and the functional units basically have the same structure as described in FIG. 1.

For example the functional units 22 are determined by the fact that the semiconductor layer 14 of each functional unit 22 is provided by a monocrystal. In addition a separate control and supply unit is preferably provided for each functional unit 22 with the aid of which the luminous film 12 is actuated, with the aid of which the potential difference between the cathode 18 and the read-out layer 16 is prescribed and with the aid of which the electrical signals detected in the read-out layer 16 are processed. Alternatively, however, a central control and supply unit 24 is also provided for the X-ray radiation detector 2.

Figure 2:
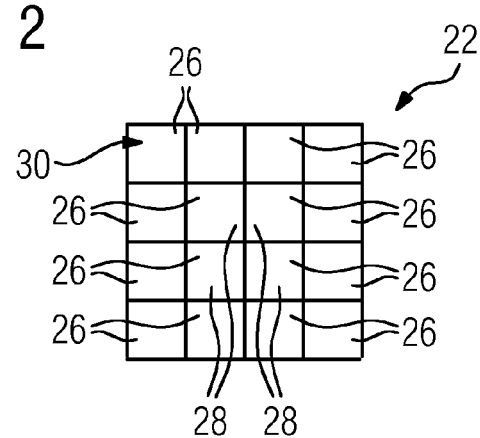
FIG. 2 shows a functional unit of the X-ray radiation detector in a top view.

According to the example embodiment from FIG. 2 sixteen individual luminous films or segments 26 are assigned to each functional unit 22, which are actuated in each case independently of each other by the respective control and supply unit and which, seen from the upper side 4, together cover the semiconductor layer 14 completely and in a planar manner. The four centrally positioned segments 26 here cover a central area 28, while the remaining segments 26 cover a peripheral area 30. The actuation of the segments 26 here takes place in such a way that in the preliminary phase the central area 28 is irradiated evenly with infrared radiation with a prescribed intensity and that the peripheral area 30 is irradiated with infrared radiation with an intensity diverging therefrom. To this end the segments 26 in the central area 28 are preferably actuated in each case in the same way and the segments 26 of the peripheral areas 30 are actuated in the same way at variance from this.

Depending on the variant embodiment of the method, different control principles are provided for the activation of each segment 26. According to the control principles shown by way of example in FIG. 3, FIG. 4 and FIG. 7, a segment 26 under examination is actuated in such a way during the preliminary phase V, that during this period this generates infrared radiation with a constant intensity I above a threshold value SW. As soon as the measuring phase M is initiated at the selected time tsm and the preliminary phase V ends, the segment 26 is differently actuated depending on the control principle. According to one control principle, as indicated in FIG. 3, the segment 26 is switched off at the start of the measuring phase M.

According to a further control principle, upon the start of the measuring phase M a permanent regulation of the intensity I is performed. The regulation here takes place for example on the basis of a calculated intensity of the X-ray radiation coupled into the semiconductor layer 14, which was determined based on the data from a topogram of the patient performed previously, or the intensity I of the infrared radiation is regulated during the measuring phase M in such a way that a generated photocurrent is kept constant. The intensity I of the infrared radiation is here adjusted to the intensity of the X-ray radiation to be measured reaching the detector, so that by means of the combination of incident X-ray radiation and incident infrared radiation a prescribed photocurrent is always generated. This control principle is outlined in FIG. 4. FIG. 5 further shows a control principle in the case of which the intensity I of the generated infrared radiation is kept constant throughout, that is during the preliminary phase V and during the measuring phase M. Finally, FIG. 5 and FIG. 6 indicate two control principles, in which the intensity I of the generated infrared radiation is also varied during the preliminary phase V.

The invention is not limited to the example embodiment described above. Rather, other variants of the invention can be derived therefrom by the person skilled in the art, without departing from the scope of the invention. In particular, all individual features described in connection with the exemplary embodiment can also be combined with each other in another manner, without departing from the scope of the invention.

The invention claimed is:
1. An X-ray radiation detector having a plurality of functional units comprising:
   an upper side, which faces an X-ray radiation source during operation;
   a semiconductor layer for direct conversion of X-ray radiation into electrical measuring signals; and
   a luminous film having a plurality of segments, arranged between the upper side and the semiconductor layer, to aid in coupling electromagnetic radiation into the semiconductor layer such that an entirety of the semiconductor layer is uniformly polarized, wherein
   each group of two or more of the plurality of segments is assigned to and is configured to be independently activated for one of the plurality of functional units such that a different intensity of the electromagnetic radiation is coupled into a central area of the corresponding functional unit relative to a peripheral area of the corresponding functional unit.

2. The X-ray radiation detector of claim 1, wherein the luminous film covers the semiconductor layer completely in a planar manner.

3. The X-ray radiation detector of claim 1, further comprising:
   a filter film, provided between the luminous film and the semiconductor layer.

4. The X-ray radiation detector of claim 1, wherein an organic LED film is provided as the luminous film.

5. The X-ray radiation detector of claim 1, wherein an electroluminescence film is provided as the luminous film.

6. The X-ray radiation detector of claim 1, wherein the plurality of segments are configured to be activated independently of each other.

7. The X-ray radiation detector of claim 1, wherein each of the plurality of functional units includes a number of detector pixels.

8. The X-ray radiation detector of claim 1, wherein the luminous film covers the semiconductor layer completely in a planar manner.

9. The X-ray radiation detector of claim 1, further comprising:
   a filter film, provided between the luminous film and the semiconductor layer.

10. The X-ray radiation detector of claim 2, further comprising:
    a filter film, provided between the luminous film and the semiconductor layer.

11. The X-ray radiation detector of claim 1, wherein the electromagnetic radiation includes a wavelength greater than 500 nm.

12. A method for an X-ray radiation detector including an upper side, facing an X-ray radiation source during operation, and a semiconductor layer for direct conversion of X-ray radiation into electrical measuring signals, the X-ray radiation detector having a plurality of functional units, the method comprising:
    providing a luminous film having a plurality of segments to, at least temporarily, couple electromagnetic radiation into the semiconductor layer such that an entirety of the semiconductor layer is uniformly polarized, and
    assigning each group of two or more of the plurality of segments to one of the plurality of functional units, each group being independently activated for one of the plurality of functional units such that a different intensity of the electromagnetic radiation is coupled into a central area of the corresponding functional unit relative to a peripheral area of the corresponding functional unit.

13. The method as claimed in claim 12, wherein the plurality of segments are configured to be activated independently of each other.

14. The method of claim 12, wherein each of the plurality of functional units includes a number of detector pixels.

15. The method of claim 13, wherein the intensity of the electromagnetic radiation during a preliminary phase is kept above a threshold value.

16. The method of claim 15, wherein the intensity of the electromagnetic radiation is reduced at a start of a measuring phase following the preliminary phase (V).

17. The method of claim 15, wherein the intensity of the electromagnetic radiation during a measuring phase following the preliminary phase is regulated depending on an expected X-ray radiation flow.

18. The method of claim 15, wherein the intensity of the electromagnetic radiation during a measuring phase following the preliminary phase is regulated in such a way that a generated photocurrent is kept constant.

19. The method of claim 15, wherein the intensity of the electromagnetic radiation during a measuring phase, following the preliminary phase, is kept constant.

20. A method for an X-ray radiation detector including an upper side, facing an X-ray radiation source during operation, and a semiconductor layer for direct conversion of X-ray radiation into electrical measuring signals, the X-ray radiation detector having a plurality of functional units, the method comprising:

at least temporarily coupling electromagnetic radiation into the semiconductor layer via a luminous film provided as part of the X-ray radiation detector such that an entirety of the semiconductor layer is uniformly polarized, the luminous film having a plurality of segments, and assigning each group of two or more of the plurality of segments to one of the plurality of functional units, each group being independently activated for one of the plurality of functional units such that a different intensity of the electromagnetic radiation is coupled into a central area of the corresponding functional unit relative to a peripheral area of the corresponding functional unit.

* * * * *